(12) United States Patent
Lee et al.

(10) Patent No.: US 6,864,753 B2
(45) Date of Patent: Mar. 8, 2005

(54) STABILIZATION TECHNIQUE FOR PHASE-LOCKED FREQUENCY SYNTHESIZERS

(75) Inventors: Tai-Cheng Lee, Cupertino, CA (US); Behzad Razavi, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/353,432

(22) Filed: Jan. 29, 2003

(65) Prior Publication Data

US 2003/0227332 A1 Dec. 11, 2003

Related U.S. Application Data

(60) Provisional application No. 60/387,757, filed on Jun. 11, 2002.

(51) Int. Cl.[7] .................................................. H03L 7/00
(52) U.S. Cl. .......................................... 331/17; 331/12
(58) Field of Search .............................. 331/12, 17, 25

(56) References Cited

U.S. PATENT DOCUMENTS

| | | | | |
|---|---|---|---|---|
| 5,113,152 A | * | 5/1992 | Norimatsu .................... | 331/11 |
| 5,995,564 A | | 11/1999 | Nagaraj et al. ............. | 375/344 |
| 6,147,561 A | | 11/2000 | Rhee et al. ................... | 331/12 |
| 6,389,090 B2 | * | 5/2002 | Zortea et al. ................ | 375/374 |

OTHER PUBLICATIONS

IBM Technical Disclosure Bulletin, Bol 27, pp. 5407–5409, Feb. 1985.*
Paul V. Brennan, Phase–Locked Loops Principles and Practice, McGraw–Hill, pp. 1–30, 1996.*
Lee, Rai–Cheng, et al., "A Stabilization Technique for Phase–Locked Frequency Synthesizers," 2001 Symposium on VLSI Circuits, Digest of Technical Papers, Kyoto, Japan, Jun. 14–16, 2001, pp. 39–42, XP–010551491.
[1] C. Lam and B. Razavi, "A 2.6–GHz/5.2–GHz Frequency Synthesizer in 0.4–$\mu$m CMOS Technology," IEEE J. Solid–State Circuits, vol. 35, pp. 788–794, May 2000.
[2] A. Zolfaghari, A. Chan, and B. Razavi, "Stacked Inductors and 1–to–2 Transformers in CMOS Technology," Proc. of CICC, pp. 345–348, May 2000.
[3] L. Lin, L. Tee, and P. R. Gray, "A 1.4–GHz Differential Low–Noise CMOS Frequency Synthesizer using a Wideband PLL Architecture," ISSCC Dig. Tech. Paper, pp. 204–205, and 458, Feb. 2000.

* cited by examiner

Primary Examiner—Robert Pascal
Assistant Examiner—Joseph Chang
(74) Attorney, Agent, or Firm—Gates & Cooper LLP (57) ABSTRACT

A stabilization technique that relaxes the tradeoff between the settling speed and the magnitude of output sidebands in phase-locked frequency synthesizers. The method introduces a zero in the open-loop transfer function through the use of a discrete-time delay element, thereby obviating the need for resistors in the loop filter.

21 Claims, 9 Drawing Sheets

STABILIZATION TECHNIQUE FOR PHASE-LOCKED FREQUENCY SYNTHESIZERS

CROSS-REFERENCE TO RELATED APPLICATIONS

This application claims priority under 35 U.S.C. §119(e) to co-pending and commonly-assigned Provisional Application Ser. No. 60/387,757, entitled "STABILIZATION TECHNIQUE FOR PHASE-LOCKED FREQUENCY SYNTHESIZERS," filed on Jun. 11, 2002, by Tai-Cheng Lee and Behzad Razavi, attorney's docket number 30448.107-US-P1, which application is incorporated by reference herein.

BACKGROUND OF THE INVENTION

1. Field of the Invention

The present invention relates generally to phase locked loops, and in particular, to a stabilization technique for phase-locked frequency synthesizers.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Phase-locked loops (PLLs) typically suffer from a trade-off between the settling time and the ripple on the control voltage, limiting the performance that can be achieved in terms of channel switching speed and output sideband magnitude in radio frequency (RF) synthesizers.

Accordingly, what is needed in the art is a loop stabilization technique that yields a small ripple while achieving fast settling. The present invention satisfies this need.

BRIEF SUMMARY OF THE INVENTION

A stabilization technique that relaxes the tradeoff between the settling speed and the magnitude of output sidebands in phase-locked frequency synthesizers. The method introduces a zero in the open-loop transfer function through the use of one or more discrete-time delay elements, thereby obviating the need for resistors in the loop filter.

In one embodiment, the phase-locked frequency synthesizer of the present invention comprises:

a phase-frequency detector (PFD) for comparing a phase of a reference signal with a phase of a feedback signal and generating Up and Down signals, depending on whether the phase of the reference signal leads or lags the phase of the feedback signal;

first and second charge pumps (CPs) for generating positive and negative charge pulses in response to the Up and Down signals from the phase-frequency detector;

a delay element for delaying the positive and negative charge pulses from the second charge pump;

a loop filter for integrating the positive and negative charge pulses from the first charge pump and the delayed positive and negative charge pulses from the second charge pump, and for generating a control voltage in response thereto;

a voltage-controlled oscillator (VCO) for accepting the control voltage from the loop filter and for changing a frequency of an output of the VCO in response thereto; and a divider for dividing the output of the VCO and generating the feedback signal therefrom.

The delay element comprises a discrete-time analog delay. The discrete-time analog delay comprises an interleaved sampling network operating at half of the reference frequency. The interleaved sampling network comprises two interleaved master-slave sample-and-hold branches, and provides a delay equal to a reference period, $1/f_{REF}$.

In another embodiment, the phase-locked frequency synthesizer of the present invention includes a delay element for delaying positive and negative charge pulses from a charge pump, wherein the delay element introduces a zero in a open-loop transfer function of the phase-locked frequency synthesizer.

The phase-locked frequency synthesizer further comprises a phase-frequency detector that compares a phase of a reference signal with a phase of a feedback signal and generates Up and Down signals, depending on whether the phase of the reference signal leads or lags the phase of the feedback signal.

The phase-locked frequency synthesizer further comprises first and second charge pumps (CPs) for generating positive and negative charge pulses in response to the Up and Down signals from the phase-frequency detector, wherein the delay element delays the positive and negative charge pulses from the second charge pump.

The delay element comprises a discrete-time analog delay. The discrete-time analog delay comprises an interleaved sampling network operating at half of the reference frequency. The interleaved sampling network comprises two interleaved master-slave sample-and-hold branches, and provides a delay equal to a reference period, $1/f_{REF}$.

A loop filter integrates the positive and negative charge pulses from the first charge pump and the delayed positive and negative charge pulses from the second charge pump, and generates a control voltage in response thereto. A voltage-controlled oscillator (VCO) that accepts the control voltage from the loop filter and changes a frequency of an output of the VCO in response thereto. A divider divides the output of the VCO and generates the feedback signal therefrom.

In yet another embodiment, the phase-locked frequency synthesizer of the present invention comprises:

N charge pumps (CPs) for generating positive and negative charge pulses in response to Up and Down signals received from a phase-frequency detector; and N−1 delay elements for delaying the positive and negative charge pulses from N−1 of the charge pumps;

wherein the positive and negative charge pulses from a first one of the N charge pumps and the delayed positive and negative charge pulses from the N−1 of the charge pumps are integrated in order to generate a control voltage for a voltage-controlled oscillator (VCO) in response thereto.

The delay elements introduce a zero in a open-loop transfer function of the phase-locked frequency synthesizer, thereby obviating a need for resistors in a loop filter of the phase-locked frequency synthesizer.

The phase-frequency detector compares a phase of a reference signal with a phase of a feedback signal and generates Up and Down signals, depending on whether the phase of the reference signal leads or lags the phase of the feedback signal.

The voltage-controlled oscillator (VCO) accepts the control voltage from the loop filter and changes a frequency of an output of the VCO in response thereto. A divider divides the output of the VCO and generates the feedback signal therefrom.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Introduction

The present invention describes a phased-locked loop (PLL) stabilization technique that yields a small ripple while achieving fast settling. Using a discrete-time analog delay, the present invention creates a zero in an open-loop transfer function of the PLL. Moreover, the present invention uses no resistors in a loop filter for the PLL, thereby lending itself to digital CMOS technologies.

Stabilization Technique

Figure 1:
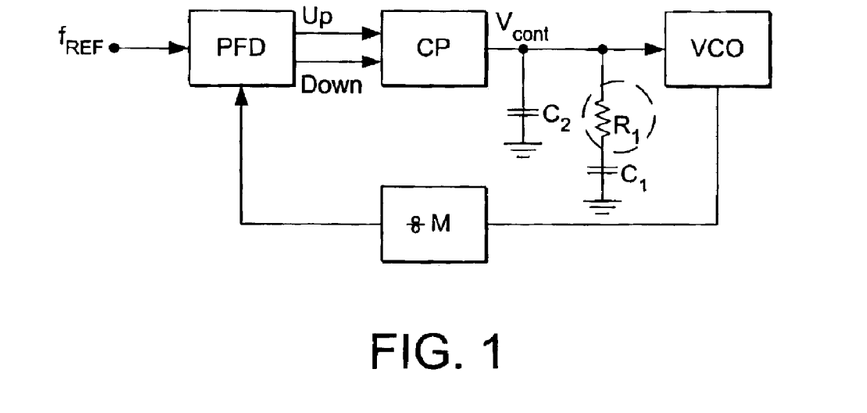
FIG. 1 is a block diagram illustrating a conventional phase-locked loop (PLL) architecture.

FIG. 1 shows a block diagram of a basic phase-locked loop (PLL) used in a frequency synthesizer. The PLL is comprised of a phase-frequency detector (PFD), a charge pump (CP), a loop filter comprised of capacitors $C_1$ and $C_2$ and resister $R_1$, a voltage-controlled oscillator (VCO), and a divider ($\div M$). The PFD provides means for comparing a phase of a reference signal having a frequency $f_{REF}$ with a phase of a feedback signal (the divided VCO signal output from the divider) and for generating "Up" and "Down" signals to the CP, depending on whether the phase of the reference signal leads or lags the phase of the feedback signal. The CP provides means for generating positive and negative charge pulses from the Up and Down signals from the PFD. The loop filter, which is a low pass filter (LPF), provides means for integrating the positive and negative charge pulses from the CP and for generating a control voltage $V_{cont}$ in response thereto. The VCO provides means for accepting the control voltage $V_{cont}$ from the loop filter and for changing a frequency of its output in response thereto. The divider provides means for dividing the output of the VCO and for generating the feedback signal therefrom.

In the loop filter, resistor $R_1$ provides a stabilizing zero and capacitor $C_2$ suppresses a glitch generated by the CP on every phase comparison instant. The glitch arises from mismatches between the width of Up and Down pulses produced by the PFD, as well as charge injection and clock feedthrough mismatches between PMOS and NMOS devices in the CP.

The principal drawback of this architecture is that $C_1$ determines the settling, whereas $C_2$ controls the ripple on the control voltage $V_{cont}$ (the waveform above the $V_{cont}$ label in the drawing illustrates this ripple). Since $C_2$ must remain below $C_1$ by roughly a factor of 10 so as to avoid underdamped settling, the loop must be slowed down by a large $C_1$ if $C_2$ is to yield a sufficiently small ripple. It is therefore desirable to seek methods of creating the stabilizing zero without the resistor so that the capacitor that defines the switching speed also directly suppresses the ripple.

It is important to note that the problem of ripple becomes increasingly more serious as the supply voltage is scaled down and/or the operating frequency goes up. The relative magnitude of the primary sidebands at the output of the VCO is given by $A_m K_{VCO}=(2\omega_{REF})$ where $A_m$ is the peak amplitude of the first harmonic of the ripple, $K_{VCO}$ is the gain of the VCO, and $\omega_{REF}$ is the synthesizer reference frequency. (For a given relative tuning range (e.g. ±10%), the gain of LC VCOs must increase if the supply voltage goes down.) If $K_{VCO}$=100 MHz/V and $f_{REF}$=1 MHz, then the fundamental ripple amplitude must be less than 63 $\mu$V to guarantee sidebands 60 dB below the carrier.

Figure 2:
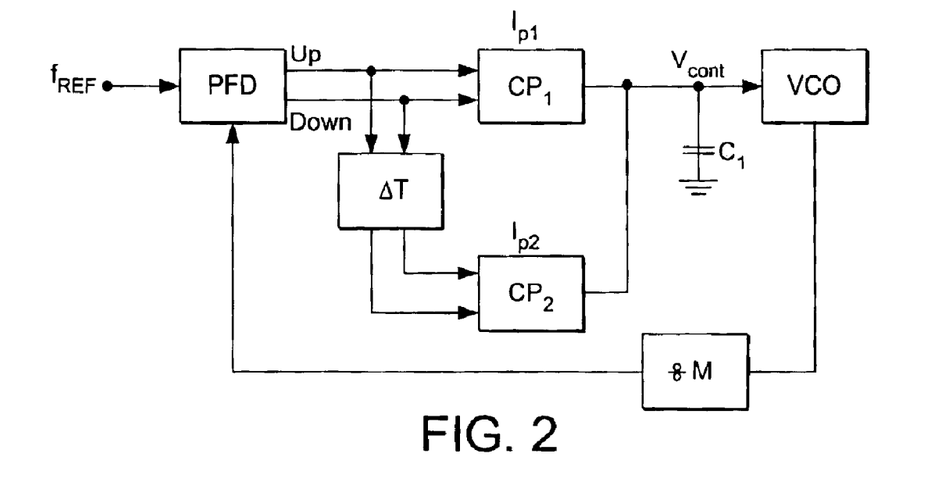
FIG. 2 is a block diagram illustrating a proposed phase-locked loop (PLL) architecture with delayed charge pump circuit according to the preferred embodiment of the present invention.

In order to arrive at the stabilization technique, consider the PLL architecture shown in FIG. 2. Here, the primary charge pump, $CP_1$, drives a single capacitor $C_1$ while a secondary charge pump, $CP_2$, injects a charge after some delay element $\Delta T$. The total current flowing through $C_1$ is thus equal to:

$$I_p = I_{p1} + I_{p2} e^{-s\Delta T} \quad (1)$$

$$\approx I_{p1} + I_{p2}(1 - s\Delta T) \quad (2)$$

where $I_p$ is the current flowing through $C_1$, $I_{p1}$ is the current value of $CP_1$, $I_{p2}$ is the current value of $CP_2$, $\Delta T$ is assumed to be much smaller than the loop time constant and s is a complex frequency.

Consequently, the transfer function of the PFD/CP/LPF combination can be expressed as:

$$\frac{V_{cont}}{\Delta \phi}(s) = \frac{I_{p1} + I_{p2}}{2\pi C_1 s} - \frac{I_{p2}}{2\pi C_1} \Delta T \quad (3)$$

where $\Delta \phi$ is the phase difference.

Assuming $I_{p2} = \alpha I_{p1}$, we have:

$$\frac{V_{cont}}{\Delta \phi}(s) = \frac{I_{p1}}{2\pi} \left( \frac{1-\alpha}{C_1 s} + \frac{\alpha \Delta T}{C_1} \right) \quad (4)$$

thereby obtaining a zero frequency at:

$$\omega_z = \frac{1-\alpha}{\alpha} \frac{1}{\Delta T} \quad (5)$$

In order to achieve a sufficiently low zero frequency, $\Delta T$ must be large or a must be close to unity. Since the accuracy in the definition of $\alpha$ is limited by mismatches between the $CP_1$ and $CP_2$, $\Delta T$ must still be a large value. For example, if $f_{REF} = 1$ MHz and $\alpha = 0.9$, then a $\Delta T$ of approximately 200 ns is required to ensure a well-behaved loop response.

The architecture of FIG. 2 suffers from a critical drawback: it requires a very long delay element $\Delta T$ before $CP_2$, while the Up and Down pulses generated by the PFD can assume a very narrow width during lock. If the bandwidth of each stage in the delay line is reduced so as to produce a large delay, then the narrow Up and Down pulses are heavily attenuated, thus giving rise to a dead zone. Conversely, if the bandwidth of each stage is wide enough to support such pulses, then a very large number of stages is required to obtain the necessary $\Delta T$.

Figure 3A:
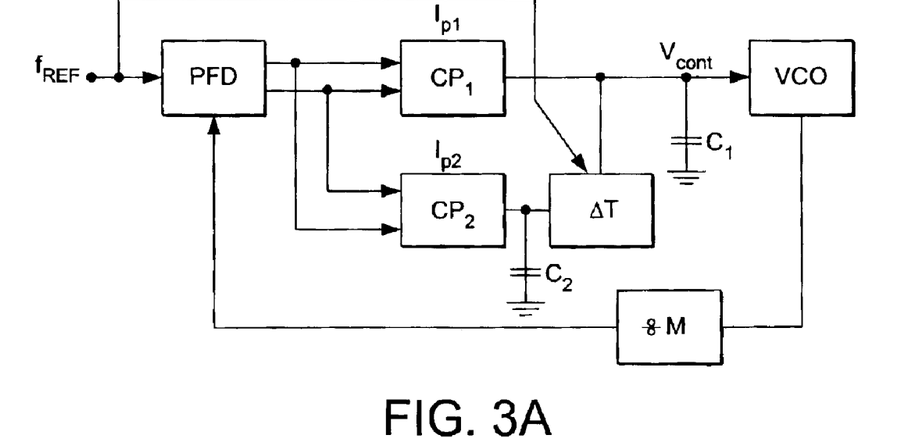
FIG. 3A is a block diagram illustrating an implementation of a phase-locked loop (PLL) with a delay sampling circuit according to the preferred embodiment of the present invention.
Figure 3B:
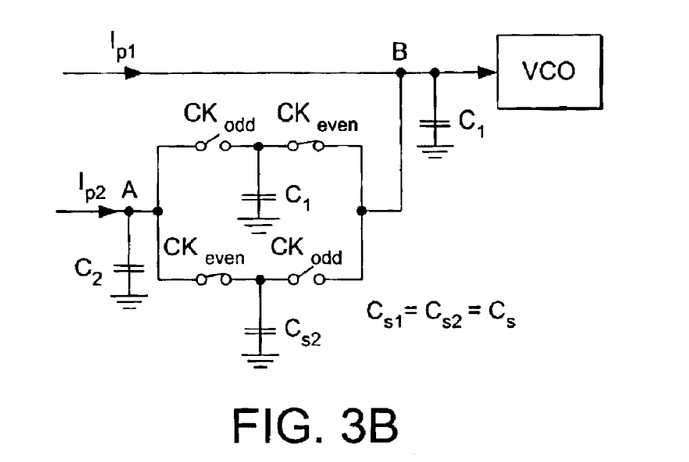
FIG. 3B is a block diagram illustrating an implementation of a phase-locked loop (PLL) with a delay sampling circuit according to the preferred embodiment of the present invention.

To resolve the above difficulty, the architecture is modified as shown in FIG. 3A, where the delay element $\Delta T$ comprises a discrete-time analog delay placed after $CP_2$ and $C_2$. The discrete-time analog delay comprises a delay network that is realized as depicted in FIG. 3B, comprising two interleaved master-slave sample-and-hold branches operating at half of the reference signal frequency.

Figure 3C:
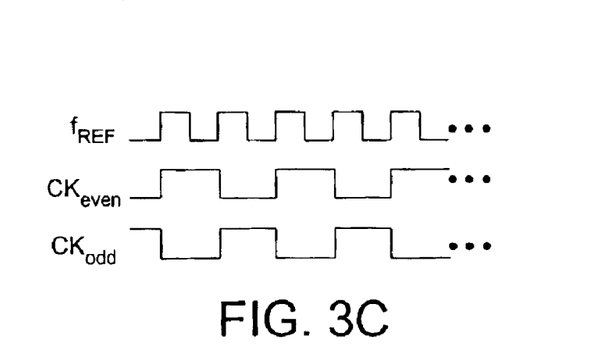
FIG. 3C is a timing diagram illustrating the operation of a phase-locked loop (PLL) with a delay sampling circuit according to the preferred embodiment of the present invention.

The delay network emulates $\Delta T$ as follows. Consider the timing diagram of FIG. 3C, which shows $f_{REF}$, $CK_{even}$ and $CK_{odd}$. When $CK_{even}$ is high, $C_{s1}$ shares a charge packet corresponding to the previous phase comparison with $C_1$ while $C_{s2}$ samples a level proportional to the present phase difference. In the next period, $C_{s1}$ and $C_{s2}$ exchange roles: when $CK_{odd}$ is high, $C_{s2}$ shares a charge packet corresponding to the previous phase comparison with $C_1$ while $C_{s1}$ samples a level proportional to the present phase difference. (Note that $C_{s1} = C_{s2} = C_s$, as indicated in FIG. 3B.) The interleaved sampling network therefore provides a delay equal to the reference signal period, $1/f_{REF}$ or $T_{REF}$.

Figure 4:
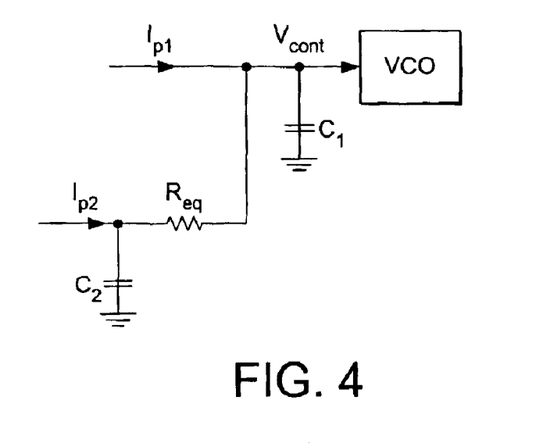
FIG. 4 is a block diagram illustrating a continuous-time approximation of a delay network according to the preferred embodiment of the present invention.

The discrete-time analog delay of FIG. 3A allows a precise definition of the zero frequency without the use of resistors. To quantify the behavior of a PLL incorporating this method, we assume the loop settling time is much greater than $1/f_{REF}$, so that the delay network can be represented by the continuous-time model shown in FIG. 4. Here, $R_{eq} = (f_{REF} C_s)^{-1}$ approximates the interleaved branches. Equation (4) can then be rewritten as:

$$\frac{V_{cont}}{\Delta \phi}(s) = \frac{I_{p1}}{2\pi} \left( \frac{1}{f_{REF} C_s} + \frac{I_{p1} + I_{p2}}{I_{p1}} \frac{1}{sC_2} \right) \quad (6)$$

where it is assumed $C_2 \gg C_1$ and the current through $C_1$ is neglected. This equation exhibits two interesting properties.

First, if $I_{p2} = -\alpha I_{p1}$, then $(I_{p1} + I_{p2})/I_{p1} = 1-\alpha$ and the value of $C_2$ is "amplified" by $(1-\alpha)^{-1}$. For example, if $\alpha = 0.9$, then $C_2$ is multiplied by a factor of 10, saving substantial area.

Second, the zero frequency is equal to:

$$\omega_z = \left(1 + \frac{I_{p2}}{I_{p1}}\right) \frac{C_s}{C_2} f_{REF} \quad (7)$$

which is a value independent of process and temperature.

Assuming $C_2 = C_s$ and $I_{p1} = -\alpha I_{p2} = I_p$, we obtain the damping factor and the settling time constant of the loop as:

$$\zeta = \frac{1}{2 f_{REF}} \sqrt{\frac{I_p}{2\pi(1-\alpha)C_2} \frac{K_{VCO}}{M}} \quad (8)$$

$$(\zeta \omega_n)^{-1} = \frac{4\pi f_{REF} C_2}{I_p} \frac{M}{K_{VCO}} \quad (9)$$

The key observation here is that the factor $(1-\alpha)^{-1}$ appears in $\zeta$ but not in $(\zeta \omega_n)^{-1}$. Thus, the two parameters can be optimized relatively independently.

Furthermore, the damping factor exhibits much less process and temperature dependence than in the conventional loop of FIG. 1. Note that for $I_{p2} = 0$, the proposed circuit resembles the topology of FIG. 1, but with the resistor replaced with a switched-capacitor network.

For a frequency synthesizer, the delay network of FIG. 2 must be designed carefully so as to minimize ripple on the control voltage. Since in the locked condition, the voltages at nodes A and B are nearly equal, the charge sharing between $C_{s1}$ or $C_{s2}$ and $C_1$ creates only a small ripple. Furthermore, the switches in the delay network are realized as small, complementary devices to introduce negligible charge injection and clock feedthrough.

Generalization of the Concept

Figure 5:
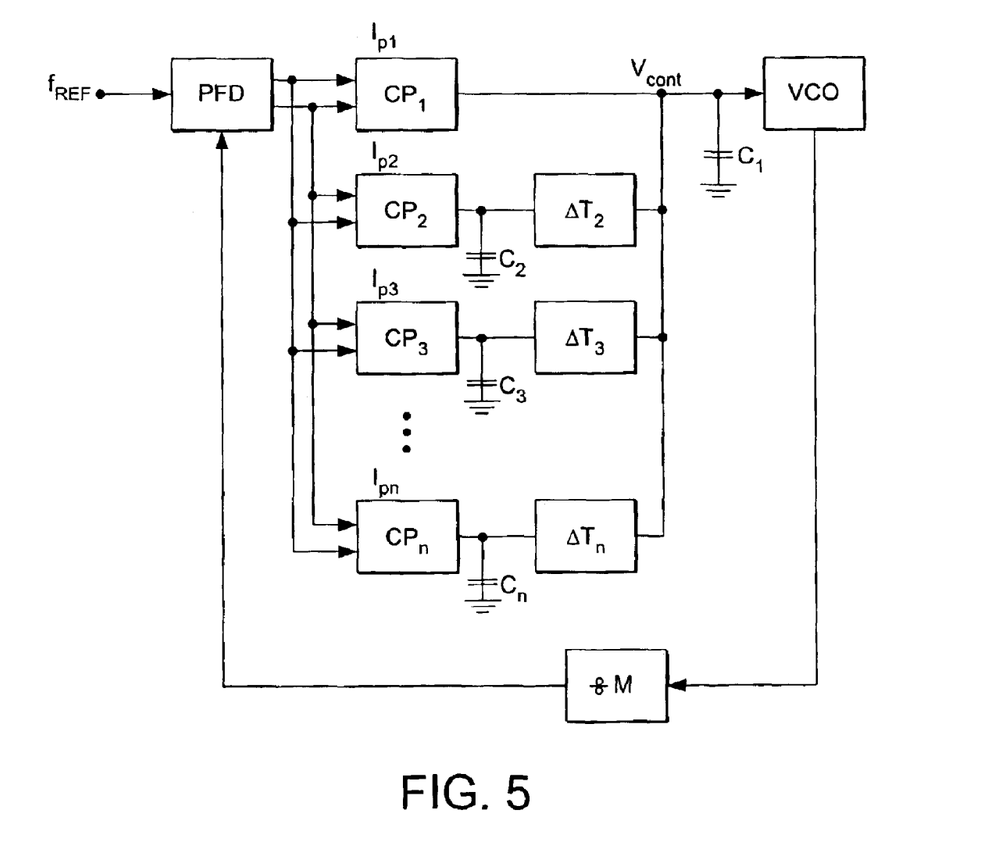
FIG. 5 is a block diagram illustrating a proposed phase-locked loop (PLL) architecture using generalized delayed charge pumps according to the preferred embodiment of the present invention.

The concept of adding a charge pump and a delay element to a conventional PLL is a special case of a more general and powerful concept. As illustrated in FIG. 5, which is a block diagram illustrating a proposed PPL architecture using generalized delayed charge pumps, the general concept employs n charge pumps ($CP_1$, $CP_2$, $CP_3$, ..., $CP_n$) having current values ($I_{p1}$, $I_{p2}$, $I_{p1}$, ..., $I_{pn}$) n−1 capacitors ($C_2$, $C_3$, ..., $C_n$, and n−1 delay elements ($\Delta T_2$, $\Delta T_3$, ..., $\Delta T_n$), with the current values and delay values chosen to optimize the tradeoff between the settling speed and the sideband magnitudes.

Another important generalization is that the n−1 delay elements ($\Delta T_2$, $\Delta T_3$, $\Delta T_n$) need not be equal to a multiple of the reference signal period $T_{REF}$; these delay values can be a fraction of $T_{REF}$ if staggered edges of $f_{REF}$ are used.

Frequency Synthesizer Design

A 2.4-GHz CMOS frequency synthesizer targeting Bluetooth™ applications has been designed using the stabilization technique described above. This section presents the architecture and building blocks of the frequency synthesizer.

Figure 6:
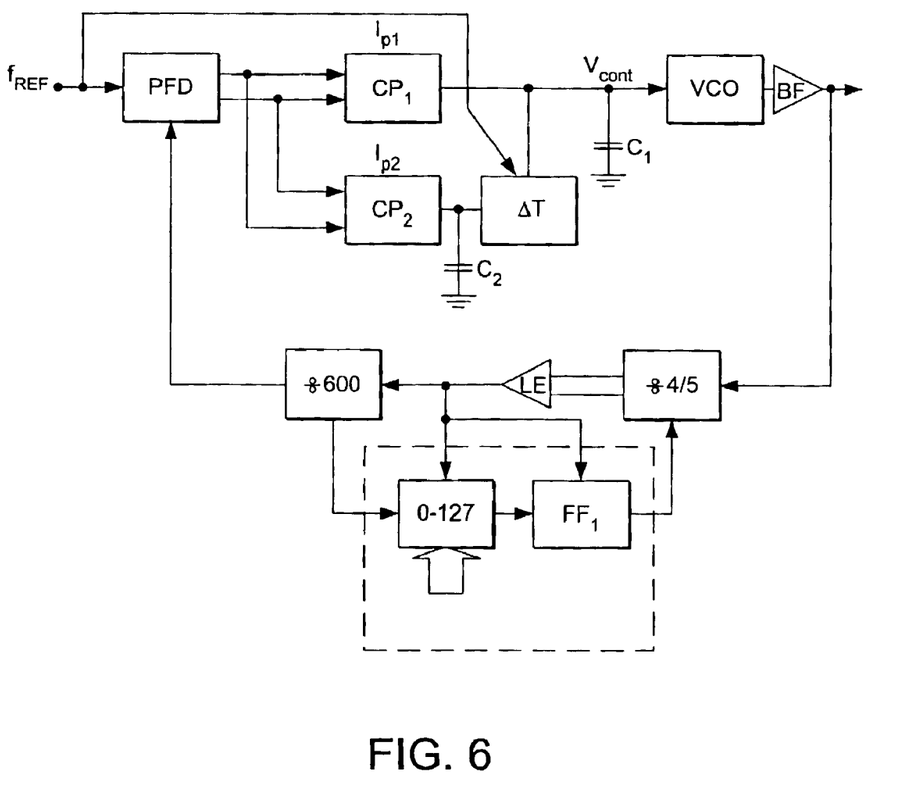
FIG. 6 is a block diagram illustrating a synthesizer architecture according to the preferred embodiment of the present invention.

Shown in FIG. 6, the frequency synthesizer uses an architecture similar to FIG. 3A, but having an integer-N architecture with a feedback divider comprised of a Prescaler (÷4/5), Level Converter (LE), Program Counter (÷600) and Swallow Counter, wherein the Swallow Counter includes a Channel Selection (0-127) and Flip-flop ($FF_1$). The feedback divider comprised of these elements has a modulus given by M=NP+S+1, where N 4 (Prescaler), P=600 (Program Counter), and S=0-127 (Channel Selection).

With $f_{REF}$=1 MHz, the output frequency covers the 2.4-GHz ISM (Industrial Scientific and Medical) band. The output of the Swallow Counter is pipelined by the Flip-flop $FF_1$ to allow a relaxed design for the Level Converter and the Swallow Counter [1]. The Buffer (BF) following the VCO suppresses the kickback noise of the Prescaler when the modulus changes. It also avoids limiting the tuning range of the VCO by the input capacitance of the Prescaler.

Figure 7A:
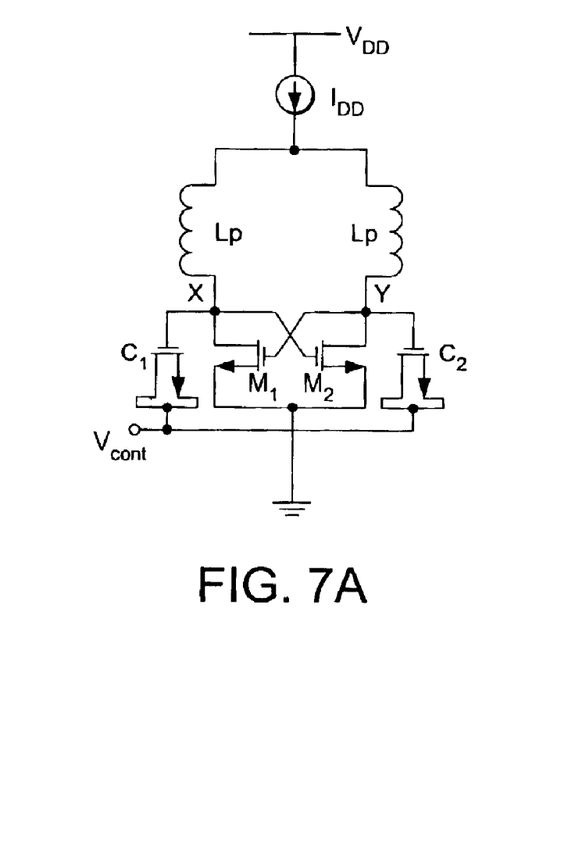
FIG. 7A is a block diagram illustrating an LC oscillator according to the preferred embodiment of the present invention.
Figure 7B:
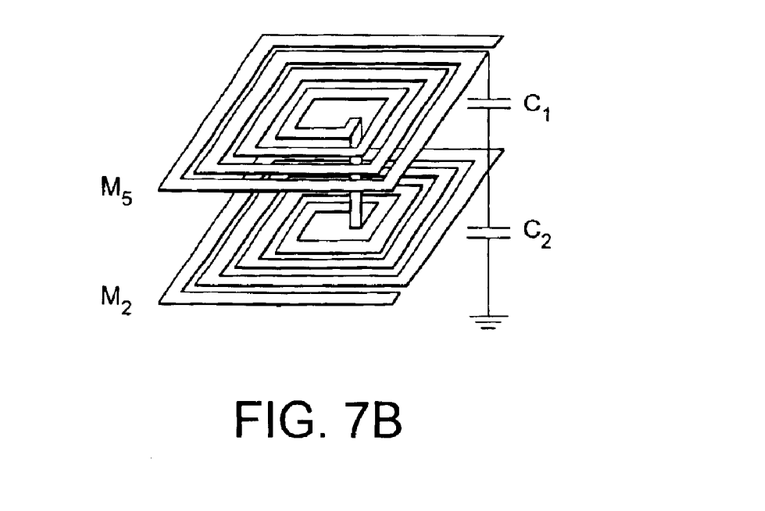
FIG. 7B is a block diagram illustrating a stacked inductor according to the preferred embodiment of the present invention.

The VCO topology is shown in FIG. 7A. The VCO is driven by the control voltage $V_{cont}$. To provide both negative and positive voltages across the MOS varactors C1 and C2, the sources of $M_1$ and $M_2$ are grounded and the circuit is biased on top by $I_{DD}$, which results from $V_{DD}$. The inductors $L_p$ are realized as shown in FIG. 7B, with the bottom spiral moved down to metal layer 2 so as to reduce the parasitic capacitance [2].

Figure 8:
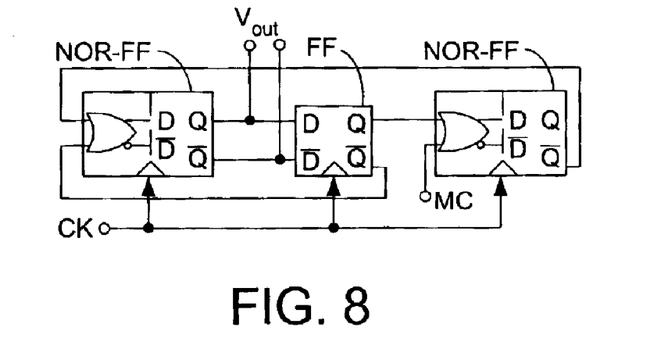
FIG. 8 is a block diagram illustrating a prescaler according to the preferred embodiment of the present invention.

The Prescaler must divide the 2.4-GHz signal while consuming a small power dissipation. Depicted in FIG. 8, the circuit employs three current-steering flip-flops (NOR-FF, FF and NOR-FF) with diode-connected loads, wherein the flip-flops have inputs D, $\overline{D}$, outputs Q, $\overline{Q}$, are clocked by the CK signal and are controlled by the MC signal. The output of the Prescaler is indicated as $V_{out}$, which is subsequently input to the Level Converter. The use of NOR gates with two of the flip-flops (NOR-FF) obviates the need for power-hungry and headroom-hungry level shift circuits required in NAND implementations.

Simulation

A 2.4-GHz frequency synthesizer with a reference frequency of 1 MHz requires a transient simulation step of approximately 20 ps for a total settling time on the order of 100 μs. The simulation therefore requires an extremely long time owing to both the vastly different time scales and the large number of devices (especially in the divider).

In order to study the loop dynamics with realistic transistor level PFD, CP and VCO design, two speed-up techniques have been employed. First, the reference frequency is scaled up by a factor of 100 and the loop filter capacitor and the divide ratio are scaled down by the same factor. Since the PFD operates reliably at 100 MHz with no dead zone, this method directly reduces the simulation time by a factor of 100. From Eqs. (8) and (9), we note that scaling $C_2$ and M by 100 maintains a constant damping factor while scaling the settling time by 100.

Second, the divider is realized as a simple behavioral model in HSPICE that uses a handful of ideal devices and its complexity is independent of the divide ratio. FIG. 9 is a block diagram of the divider, which includes an input $V_b$, two sets of switches CK and $\overline{CK}$, capacitors C, an op-amp (OA) and two comparators (CO) driven by the output of the OA, and $V_{REF}$ and $V_{TH}$, respectively. The first comparator compares the voltage $V_A$ at node A with a reference voltage $V_{REF}$, thereby generating a signal, having a voltage $V_B$ at node B, which controls a switched capacitor network for the op-amp OA. The second comparator compares the voltage $V_A$ at node A with a threshold voltage $V_{TH}$, thereby generating the $V_{out}$ signal. The timing diagram of FIG. 8B shows the relationships between $V_{TH}$, $V_A$, $V_B$, and $V_{out}$.

Figure 9A:
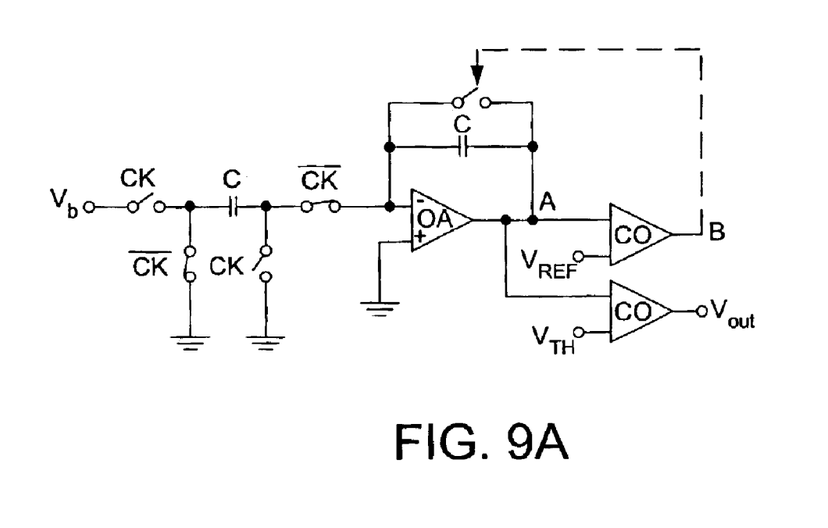
FIG. 9A is a block diagram illustrating a divider according to the preferred embodiment of the present invention.
Figure 9B:
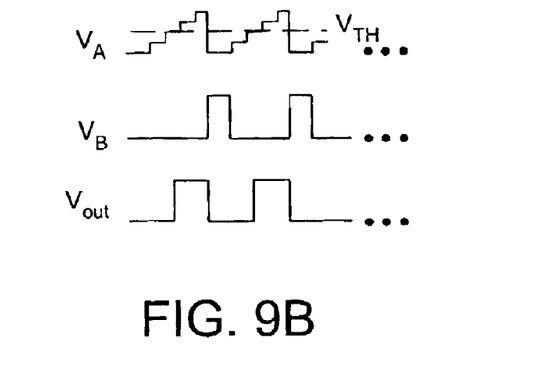
FIG. 9B is a timing diagram illustrating the operation of the divider according to the preferred embodiment of the present invention.

As illustrated in the block diagram of FIG. 9A and the timing diagram of FIG. 9B, the principle of the behavioral divider is to pump a well-defined charge packet into an integrator in every period and reset the integrator when its output exceeds a certain level, $V_{REF}$. Using an ideal op amp (OA), comparator (CO), and switches (CK and $\overline{CK}$) with proper choice of $V_b$ and $V_{REF}$, the circuit can achieve arbitrarily long high divide ratios. This techniques yields another factor of 20 improvement in the simulation speed, allowing the synthesizer to be simulated in less than 3 minutes on an Ultra 10 Sun workstation.

Experimental Results

Figure 10:
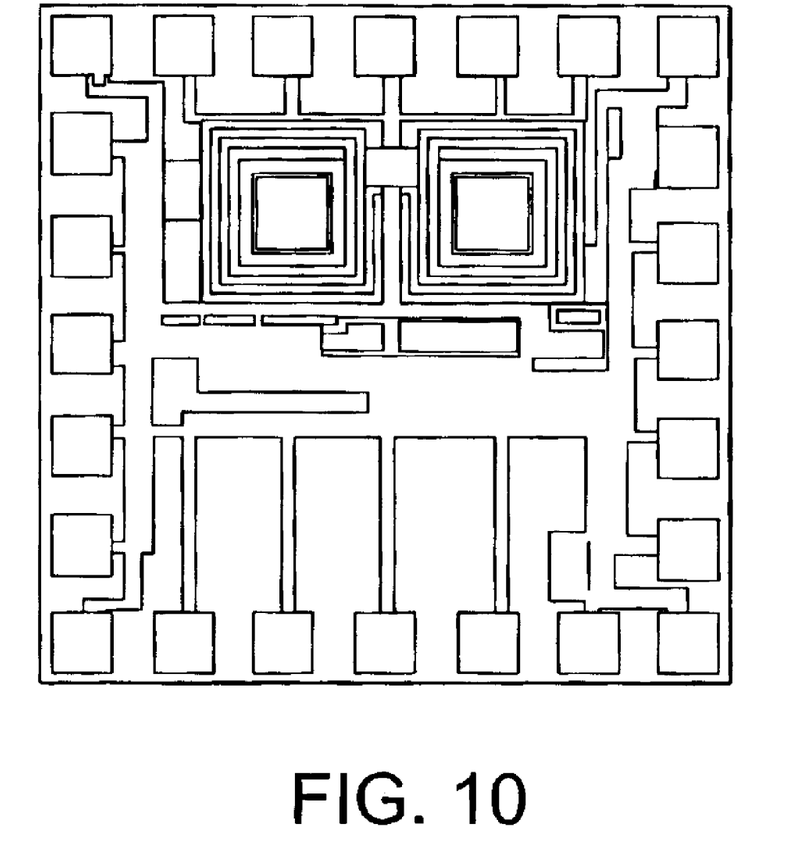
FIG. 10 is a die photo of a frequency synthesizer according to the preferred embodiment of the present invention.

The frequency synthesizer has been fabricated in a digital 0.25-μm CMOS technology. Shown in FIG. 10 is a photograph of the die, whose active area measures 0.65 mm×0.45 mm. The circuit has been tested in a chip-on-board assembly while running from a 2.5-V power supply.

Figure 11:
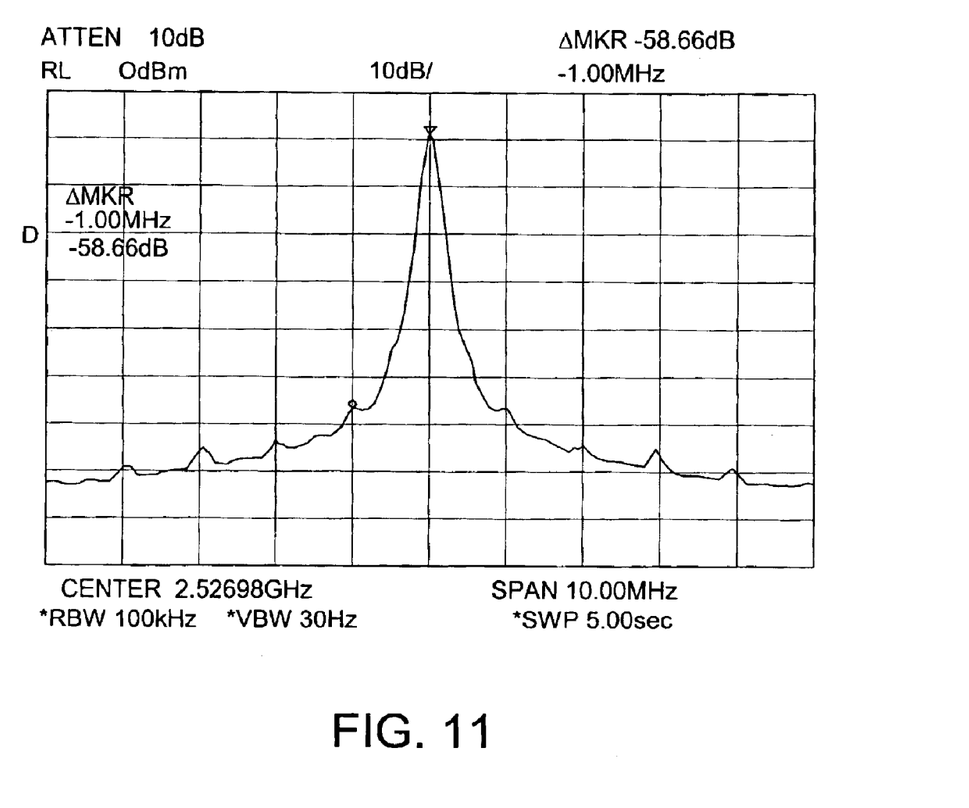
FIG. 11 is a graph illustrating a measured spectrum at the output of the VCO.

FIG. 11 shows the output spectrum in the locked condition. The phase noise is equal to −112 dBc/Hz at 1 MHz offset, well exceeding the Bluetooth™ requirement. The primary reference sidebands are at approximately −58.7 dBc. This level is lower than that achieved in [3] with differential VCO control and an 86.4-MHz reference frequency.

Figure 12:
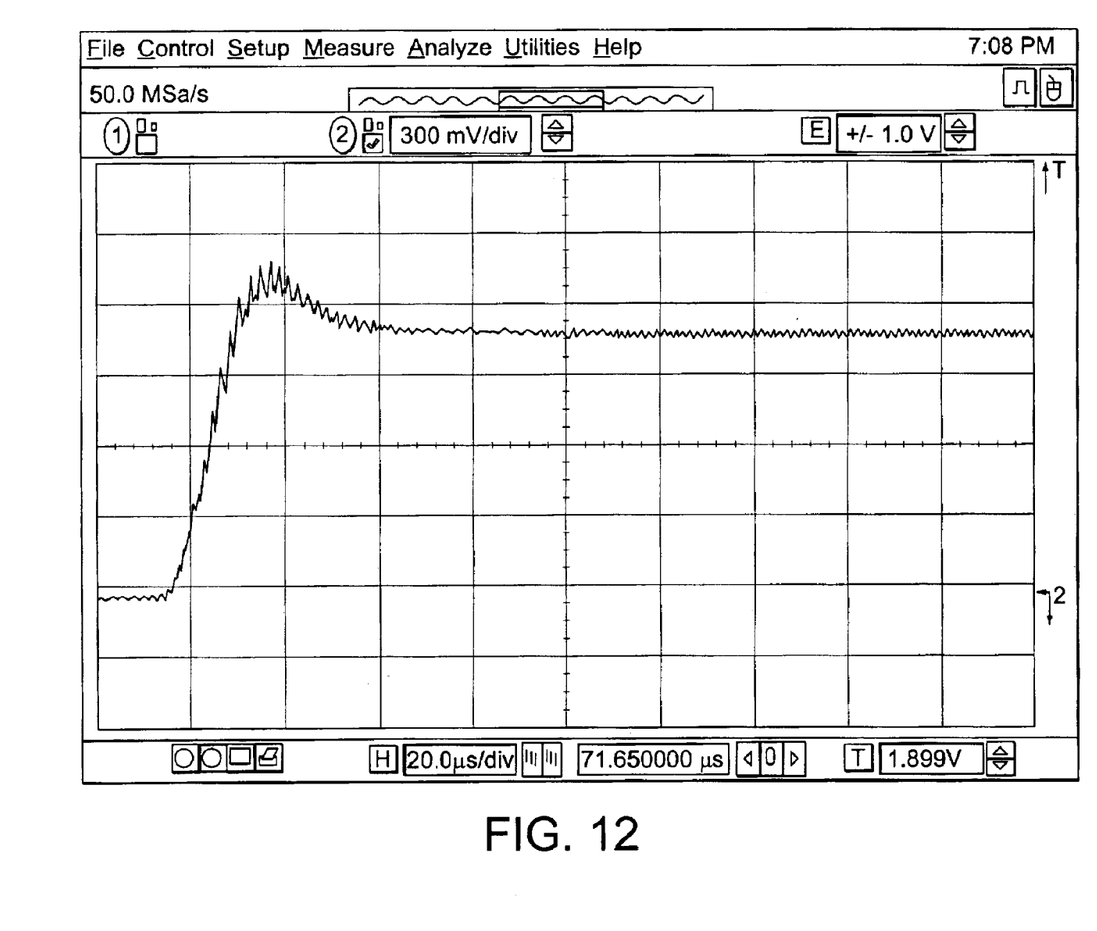
FIG. 12 is a graph illustrating a control voltage during loop setting.

FIG. 12 plots the measured settling behavior of the frequency synthesizer when its channel number is switched by 64. The settling time is about 60 μs, i.e., 60 input cycles.

Table 1 below provides a performance summary of the frequency synthesizer.

| | |
|---|---|
| Center Frequency | 2.4 GHz |
| Channel Spacing | 1 MHz |
| No. of channels | 128 |
| Phase Noise at 1 MHz Offset | −112 dBc/Hz |
| Reference Sidebands | −58.7 dBc |
| Settling Time | 60 μs |
| Power Dissipation | |
| VCO | 10 mW |
| VCO Buffer | 3 mW |
| Divider | 6 mW |
| Charge Pump | 0.5 mW |
| Others | 0.5 mW |
| Total | 20 mW |
| Supply Voltage | 2.5 V |
| Die Area | 0.65 mm × 0.45 mm |
| Technology | 0.25-μm CMOS |

REFERENCES

The following references are incorporated by reference herein:

[1] C. Lam and B. Razavi, "A 2.6-GHz/5.2-GHz Frequency Synthesizer in 0.4-μm CMOS Technology," IEEE J. Solid-State Circuits, vol. 35, pp. 788–794, May 2000.

[2] A. Zolfaghari, A. Chan, and B. Razavi, "Stacked Inductors and 1-to-2 Transformers in CMOS Technology," Proc. of CICC, pp. 345–348, May 2000.

[3] L. Lin, L. Tee, and P. R. Gray, "A 1.4-GHz Differential Low-Noise CMOS Frequency Synthesizer using a Wideband PLL Architecture," ISSCC Dig. Tech. Paper, pp. 204–205, February 2000.

CONCLUSION

This concludes the description of the preferred embodiment of the invention. The following describes some alternative embodiments for accomplishing the present invention.

For example, the present invention could be used with many types of circuits, and not just those described herein. Moreover, any number of different components or different configurations of components could be used without departing from the scope of the present invention. Finally, any number of n charge pumps and n−1 delay elements could be used in the present invention.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A phase-locked frequency synthesizer, comprising:
    a phase-frequency detector (PFD) for comparing a phase of a reference signal with a phase of a feedback signal and generating Up and Down signals, depending on whether the phase of the reference signal leads or lags the phase of the feedback signal;
    first and second charge pumps (CPs) for generating positive and negative charge pulses in response to the Up and Down signals from the phase-frequency detector;
    a delay element for delaying the positive and negative charge pulses from the second charge pump;
    a loop filter for integrating the positive and negative charge pulses from the first charge pump and the delayed positive and negative charge pulses from the second charge pump, and for generating a control voltage in response thereto;
    a voltage-controlled oscillator (VCO) for accepting the control voltage from the loop filter and for changing a frequency of an output of the VCO in response thereto; and
    a divider for dividing the output of the VCO and generating the feedback signal therefrom.

2. The phase-locked frequency synthesizer of claim 1, wherein the delay element comprises a discrete-time analog delay.

3. The phase-locked frequency synthesizer of claim 2, wherein the discrete-time analog delay comprises an interleaved sampling network operating at half of the reference frequency.

4. The phase-locked frequency synthesizer of claim 3, wherein the interleaved sampling network comprises two interleaved master-slave sample-and-hold branches.

5. The phase-locked frequency synthesizer of claim 4, wherein the interleaved sampling network provides a delay equal to a reference period, $1/f_{REF}$.

6. A phase-locked frequency synthesizer, comprising:
    a phase-frequency detector (PFD) for generating signals indicating a phase of a reference signal as compared to a phase of a feedback signal;
    a plurality of charge pumps (CPs) for generating positive and negative charge pulses in response to the signals generated by the phase-frequency detector;
    a delay element for delaying positive and negative charge pulses from at least one of the charge pumps, wherein the delay element introduces a zero in a open-loop transfer function of the phase-locked frequency synthesizer;
    a loop filter for integrating the positive and negative charge pulses that are delayed with the positive and negative charge pulses the are not delayed, and for generating a control voltage in response thereto; and
    a voltage-controlled oscillator (VCO) for changing a frequency of the feedback signal in response to the control voltage.

7. The phase-locked frequency synthesizer of claim 6, wherein the phase-frequency detector compares a phase of the reference signal with a phase of the feedback signal and generates Up and Down signals, depending on whether the phase of the reference signal leads or lags the phase of the feedback signal.

8. The phase-locked frequency synthesizer of claim 6, wherein the delay element comprises a discrete-time analog delay.

9. The phase-locked frequency synthesizer of claim 8, wherein the discrete-time analog delay comprises an interleaved sampling network operating at half of the reference frequency.

10. The phase-locked frequency synthesizer of claim 9, wherein the interleaved sampling network comprises two interleaved master-slave sample-and-hold branches.

11. The phase-locked frequency synthesizer of claim 10, wherein the interleaved sampling network provides a delay equal to a reference period, $1/f_{REF}$.

12. A phase-locked frequency synthesizer, comprising:
    a phase-frequency director (PFD) for comparing a reference signal with a feedback signal and for generating Up and Down signals in response thereto;
    N charge pumps (CPs) for generating positive and negative charge pulses in response to the Up and Down signals received from the phase-frequency detector;
    N−1 delay elements for delaying the positive and negative charge pulses from N−1 of the charge pumps;
    a loop filter for integrating the positive and negative charge pulses from a first one of the N charge pumps and the delayed positive and negative charge pulses from the N−1 of the charge pumps in order to generate a control voltage; and
    a voltage-controlled oscillator (VCO) for changing a frequency of the feedback signal in response to the control voltage.

13. The phase-locked frequency synthesizer of claim 12, wherein the delay elements introduce a zero in a open-loop transfer function of the phase-locked frequency synthesizer, thereby obviating a need for resistors in a loop filter of the phase-locked frequency synthesizer.

14. The phase-locked frequency synthesizer of claim 13, wherein the phase-frequency detector compares a phase of the reference signal with a phase of the feedback signal and generates the Up and Down signals, depending on whether the phase of the reference signal leads or lags the phase of the feedback signal.

15. The phase-locked frequency synthesizer of claim 14, wherein the voltage-controlled oscillator (VCO) accepts the control voltage from the loop filter and changes a frequency of an output of the VCO in response thereto.

16. The phase-locked frequency synthesizer of claim 15, wherein a divider divides the output of the VCO and generates the feedback signal therefrom.

17. A method for operating a phase-locked frequency synthesizer, comprising:

comparing a reference signal with a feedback signal in a phase-frequency detector (PFD) and generating Up and Down signals in response thereto;

generating positive and negative charge pulses in N charge pumps (CPs) in response to the Up and Down signals received from the phase-frequency detector;

delaying the positive and negative charge pulses from N−1 of the charge pumps in N−1 delay elements;

integrating the positive and negative charge pulses from a first one of the N charge pumps and the delayed positive and negative charge pulses from the N−1 of the charge pumps in a loop filter in order to generate a control voltage; and changing a frequency of the feedback signal in a voltage-controlled oscillator (VCO) in response to the control voltage.

18. The method of claim 17, wherein the delay elements introduce a zero in a open-loop transfer function of the phase-locked frequency synthesizer, thereby obviating a need for resistors in a loop filter of the phase-locked frequency synthesizer.

19. The method of claim 18, wherein the phase-frequency detector compares a phase of the reference signal with a phase of the feedback signal and generates the Up and Down signals, depending on whether the phase of the reference signal leads or lags the phase of the feedback signal.

20. The method of claim 19, wherein the voltage-controlled oscillator (VCO) accepts the control voltage from the loop filter and changes a frequency of an output of the VCO in response thereto.

21. The method of claim 20, wherein a divider divides the output of the VCO and generates the feedback signal therefrom.

* * * * *

UNITED STATES PATENT AND TRADEMARK OFFICE
CERTIFICATE OF CORRECTION

PATENT NO. : 6,864,753 B2
DATED : March 8, 2005
INVENTOR(S) : Lee et al.

It is certified that error appears in the above-identified patent and that said Letters Patent is hereby corrected as shown below:

Column 10,
Line 6, "the" should read -- that --.
Line 22, "the" should read -- a --, after "reference" insert -- signal --.

Signed and Sealed this

Sixteenth Day of August, 2005

JON W. DUDAS
*Director of the United States Patent and Trademark Office*